United States Patent
Greene et al.

(10) Patent No.: US 10,790,372 B2
(45) Date of Patent: Sep. 29, 2020

(54) DIRECT GATE METAL CUT USING SELECTIVE DEPOSITION TO PROTECT THE GATE END LINE FROM METAL SHORTS

(71) Applicant: International Business Machines Corporation, Armonk, NY (US)

(72) Inventors: Andrew Greene, Albany, NY (US); Ekmini Anuja De Silva, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/244,141

(22) Filed: Jan. 10, 2019

(65) Prior Publication Data
US 2020/0227532 A1    Jul. 16, 2020

(51) Int. Cl.
*H01L 21/28*    (2006.01)
*H01L 29/51*    (2006.01)
(Continued)

(52) U.S. Cl.
CPC .......... *H01L 29/42364* (2013.01); *H01L 21/823431* (2013.01); *H01L 21/823437* (2013.01);
(Continued)

(58) Field of Classification Search
CPC ... H01L 29/42; H01L 29/423; H01L 29/4236; H01L 29/42364; H01L 29/51;
(Continued)

(56) References Cited

U.S. PATENT DOCUMENTS 6,297,169 B1  10/2001  Mangat et al.
6,518,168 B1   2/2003  Clem et al.
(Continued)

OTHER PUBLICATIONS

Love, J. Christopher et al.; "Self-Assembled Monolayers of Thiolates on Metals as a Form of Nanotechnology", Chemical Reviews, 2005, vol. 105, No. 4, pp. 1103-1169.
(Continued)

*Primary Examiner* — Monica D Harrison
(74) *Attorney, Agent, or Firm* — Cantor Colburn LLP; Vazken Alexanian

(57) ABSTRACT

A method of fabricating a semiconductor device includes forming an intermediate semiconductor device having dummy gate material and an oxide layer. The intermediate semiconductor device includes a substrate, fins, a shallow trench isolation layer, an oxide layer, and an interlayer dielectric. The dummy gate material and the oxide layer are removed. A high k dielectric material is deposited on a top surface of the shallow trench isolation layer. A replacement metal gate stack is deposited. Gate cut lithographing patterning is performed to open portions of the gate. The replacement metal gate stack and the interlayer dielectric are etched. A cap layer is deposited on exposed ends of at least two replacement metal gate. Trenches are filled with the interlayer dielectric and the semiconductor device is formed. Selective deposition of the insulating material on the ends of the replacement metal gates prevents gate end shorts.

17 Claims, 8 Drawing Sheets

(51) Int. Cl.
*H01L 29/423* (2006.01)
*H01L 27/088* (2006.01)
*H01L 29/66* (2006.01)
*H01L 21/8234* (2006.01)

(52) U.S. Cl.
CPC ........ *H01L 27/0886* (2013.01); *H01L 29/517* (2013.01); *H01L 29/518* (2013.01); *H01L 29/66545* (2013.01)

(58) Field of Classification Search
CPC ..... H01L 29/517; H01L 29/518; H01L 29/66; H01L 29/665; H01L 29/6654; H01L 29/66545; H01L 27/08; H01L 27/088; H01L 27/0886; H01L 21/82; H01L 21/823; H01L 21/8234; H01L 21/82843; H01L 21/823431; H01L 21/823437
USPC ....................................................... 257/401
See application file for complete search history.

(56) References Cited

U.S. PATENT DOCUMENTS

| | | | |
|---|---|---|---|
| 7,790,631 | B2 | 9/2010 | Sharma et al. |
| 8,889,500 | B1* | 11/2014 | Kamineni ......... H01L 29/66795 257/268 |
| 9,679,985 | B1 | 6/2017 | Wu et al. |
| 9,704,754 | B1 | 7/2017 | Bao et al. |
| 9,805,983 | B1 | 10/2017 | Cheng et al. |
| 9,960,254 | B1 | 5/2018 | Bao et al. |
| 2015/0340461 | A1 | 11/2015 | Wei et al. |
| 2016/0181428 | A1* | 6/2016 | Chen .................. H01L 29/7856 257/401 |

OTHER PUBLICATIONS

Ulman, Abraham; "Formation and Structure of Self-Assembled Monolayers", Chemical Reviews, 1996, vol. 96, No. 4, pp. 1533-1554.

* cited by examiner

US 10,790,372 B2

DIRECT GATE METAL CUT USING SELECTIVE DEPOSITION TO PROTECT THE GATE END LINE FROM METAL SHORTS

BACKGROUND

The present invention generally relates to fabrication methods and resulting structures for semiconductor devices. More specifically, the present invention relates to fabrication and resulting structures for performing direct gate metal cuts using selective deposition to protect the gate end line from metal shorts.

As the number of devices per chip increases, both inter and intra device dimensions decrease. Each successive generation of design rules are challenged to deliver processability without compromising function. The pursuit within the semiconductor industry of high density, high performance, and low cost devices and the attendant implementation of nanometer-scale process nodes have resulted in the development of three-dimensional (3D) architectures such as a fin-shaped field effect transistor (FinFET).

Within a typical FinFET, the channel between the source and the drain is formed as a raised fin over a substrate. The gate electrode is then formed over the sidewalls and top of the channel. Compared to traditional (planar) metal oxide semiconductor field effect transistors (MOSFETs), the three-dimensional gate structure associated with the FinFET provides better electrical control over the channel, which helps decrease leakage current and minimize other short-channel effects.

Even within 3D designs, there is a need for efficient integration. For example, in a FinFET it would be beneficial to locate respective gate ends closer to the fins, i.e., decrease the gate end-to-fin spacing for the dummy gate and thus decrease the associated parasitic capacitance. It would therefore be beneficial to develop a process flow to accomplish the foregoing while not otherwise adversely affecting device performance.

SUMMARY

Embodiments of the present invention are directed to a method for fabricating a semiconductor device. A non-limiting example of the method includes forming an intermediate semiconductor device having dummy gate material and an oxide layer, wherein the intermediate semiconductor device further includes a substrate, a plurality of fins, a shallow trench isolation layer, an oxide layer, and an interlayer dielectric, wherein the fins extend into the dummy gate material; removing the dummy gate material and the oxide layer from the intermediate semiconductor device; depositing a high k dielectric material on a top surface of the shallow trench isolation layer, thereby surrounding the fins; depositing a replacement metal gate stack over the high k dielectric material; filling a top portion of the intermediate semiconductor device with a gate contact metal; performing gate cut lithographing patterning to open portions of the gate to be cut; anisotropically etching the replacement metal gate stack and the interlayer dielectric to form at least two replacement metal gates in the shallow trench isolation layer; selectively depositing insulating material on exposed ends of the at least two replacement metal gates, forming a cap layer on each of the replacement metal gates; and filling trenches between each gate with the interlayer dielectric and forming the semiconductor device. Selective deposition of the insulating material on the ends of the replacement metal gates prevents gate end shorts in the semiconductor device.

Embodiments of the invention are directed to a semiconductor device. A non-limiting example of the semiconductor device includes a substrate including a plurality of fins and a shallow trench isolation layer; a high k dielectric material on a top surface of the shallow trench isolation layer, surrounding the fins; at least two replacement metal gates including a replacement gate stack over the high k dielectric material and a gate contact metal over the gate stack; a cap layer including an insulating material on exposed ends of the at least two replacement metal gates; and source and drain regions etched into the shallow trench isolation layer. The cap layer prevents gate end shorts in the semiconductor device.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
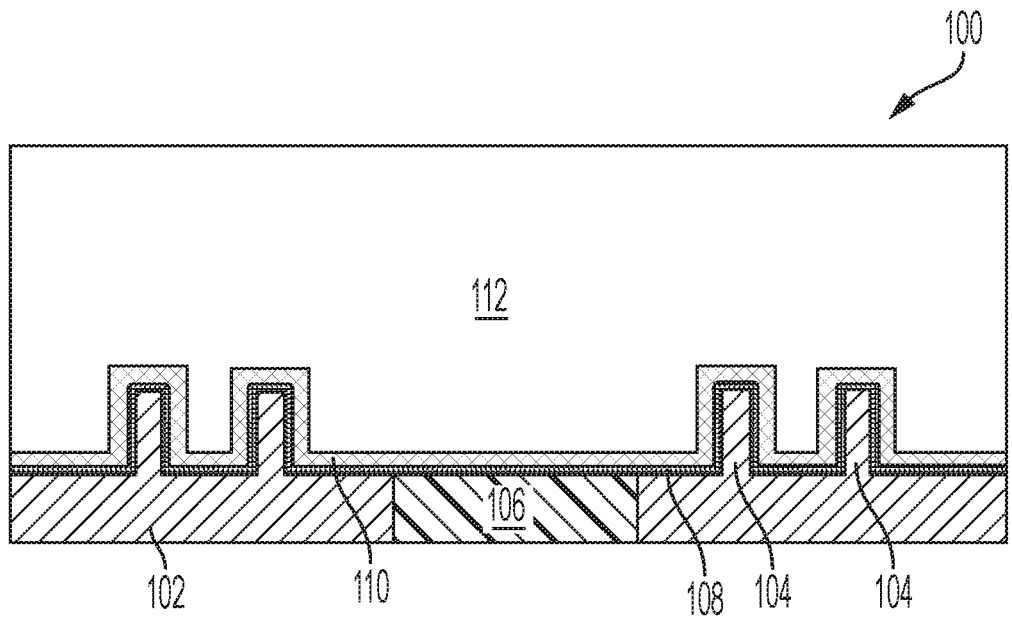
FIG. 1 depicts a cross-sectional view of an intermediate semiconductor device after fabrication operations according to embodiments of the invention, wherein the view is taken across the fins and along the gate.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as design rules for semiconductor devices extend below 32 nanometers (nm), performing the gate cut in the dummy polysilicon gate during the poly open chemical mechanical planarization (CMP) module, can lead to defectivity issues in the replacement metal gate (RMG) module. Due to a limited gate past end fin space, the silicon capping layer used in reliability annealing can pinch off and not be removed during subsequent etching. Incomplete coverage of work function metal on the end fin in this space can lead to poor electrostatic control of the channel and performance degradation.

Turning now to an overview of the aspects of the invention, one or more embodiments of the invention address the above-described shortcomings of the prior art by providing a process that can provide a reliability anneal and strip completed on continuous gates with no issues of silicon residue formation when the gate cute is performed in the replacement metal gate (RMG) module, after filling with metal. Such a process has the potential to scale the gate past the end fin and the potential to relax the gate cut size, i.e., ability to provide a larger gate cut with the same gate past the end fin. For example, if the gate cut is done in the RMG module, since the RMG is already in place and the work function metal (WMF) and high k dielectric materials are not present on the gate cut pillar (as is the case in the current technology), which means that the gate cut can have an increased width, that the gate extension can be scaled past the fin. Alternatively the gate cut dimension can be kept the same and the SRAM cell size can be reduced allowing more elements to fit within the SRAM array. Generally, two issues can arise when performing the gate cut in the RMG module. The first issue is the need to minimize interlayer dielectric loss within the gate cut region to less than 10 nm in order to prevent the obstruction of a local metal interconnect running past the gate cut region during later source-drain contact formation. The second issue is the need for minimal critical dimension increase of the gate cut size during patterning and metal etching processes.

Direct etching of a metal in the RMG module, such as tungsten (W), requires selectivity to an oxide of the interlayer dielectric (ILD), such as silicon dioxide ($SiO_2$) between gates. If a portion of the ILD is lost during metal etching, it is filled with the gate cut insulator, e.g., silicon nitride (SiN), $SiO_2$, etc. If the gate cut insulator is SiN, the reactive ion etching of the source/drain contact trench is blocked in the local interconnect. If the gate cut insulator is $SiO_2$, the reactive ion etching of the source/drain contact in the gate cut region will etch the $SiO_2$ away, which leads to shorting of the source/drain contact to the gate end.

The process described herein solves these problems with an anisotropic metal bulk etch in the RMG module which etches metals and the interlayer dielectric without any required selectivity. The process allows for a vertical gate profile and critical dimension control along with capping of exposed metal gate end line using selective deposition. This selective deposition effectively passivates any exposed metal and protects against source/drain shorting during contact etching and metallization. In one or more embodiments, the gate cut trench can be filled with an oxide to prevent an opening in the source/drain and/or a blocked source/drain.

In the present process, the metal layer, work function metal layer, and the interlayer dielectric are etched down to the gate bottom and into the shallow trench isolation region. Then, a nitride, e.g., SiN is deposited on the gate ends. The nitride caps and protects the metal from shorting to the future gate cut after reactive ion etching. The trenches between gates are filled with an interlayer dielectric to leave a layer of material such as an oxide for contact patterning and etching which will not obstruct the local contact metal interconnect.

Selective growth of a metal on a dielectric can occur through an area deactivation mechanism. In this process, protection of an oxide surface can occur with a passivation layer such a self-assembled monolayer or polymer brush that selectively binds to oxide and not metal or silicon. Alkylsilanes or aryl silanes type self assembled monolayers or polystyrene, poly methyl methacrylate type polymers <typically with in 5-25 k molecular weight) with (chloro, bromo, iodo alkoxy head groups) are each a material that can selectively bind to $SiO_2$, but not Si or a metal surface. At this point, dielectric growth can be enabled from the unprotected metal layer. Metals can include tungsten (W), cobalt (Co), tin, nitride, TiAlC, or a combination including at least one of the foregoing. Dielectric materials can include silicon oxide, silicon nitride, SiBCN, SiOCN, hafnium oxide (HfOx), aluminum oxide (AlOx), TiOx, or a combination including at least one of the foregoing.

Turning now to a more detailed description of aspects of the present invention, FIGS. 1 to 12 depict an overview of a process according to embodiments of the invention. In FIG. 1, an intermediate semiconductor device 100 is shown as a cross-sectional view taken across the fins and along the gate region. The intermediate semiconductor device contains a substrate 102 with fins 104 dispersed thereon, a shallow trench isolation (STI) region 106, a high k dielectric layer 108 spread across the substrate 102, fins 104 and STI region 106, a work function metal (WFM) layer 110 disposed across the high k dielectric layer 108, and a gate contact metal 112, e.g., tungsten or cobalt. The high k dielectric layer 108 can be the gate oxide.

Figure 2:
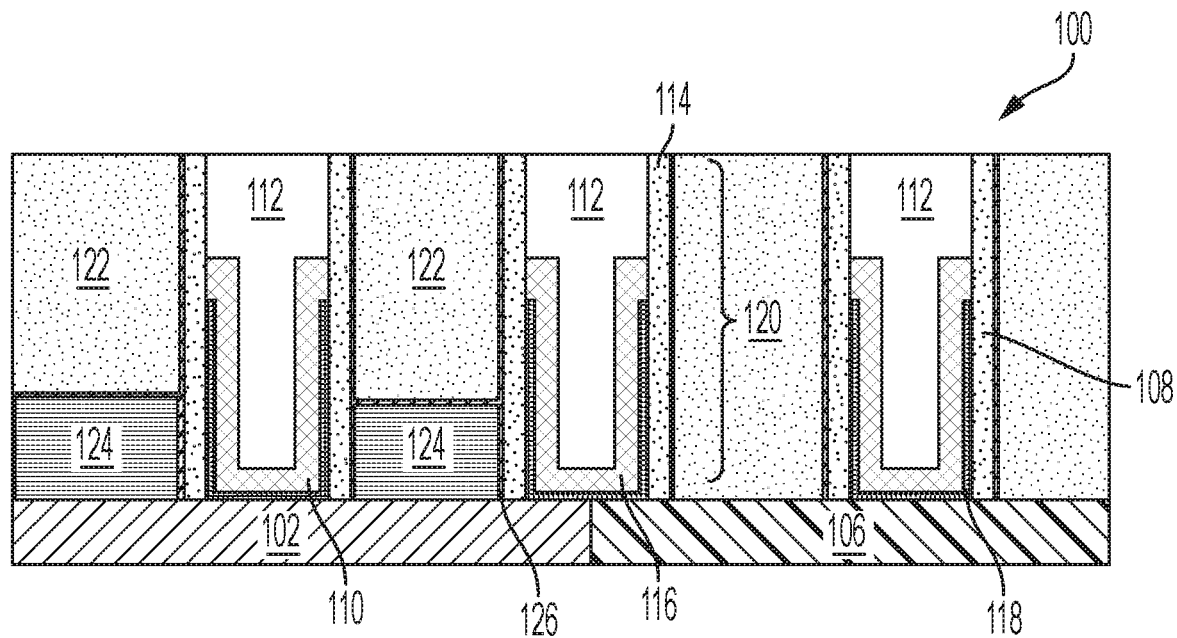
FIG. 2 depicts a cross-sectional view of the intermediate semiconductor device after fabrication operations according to embodiments of the invention, wherein the view is taken across the gate and along the fins.

In FIG. 2 a cross-sectional view of the semiconductor device 100 taken across the gate region and along the fins after gate metal fill and CMP processes have occurred is shown. Sidewall spacers 114 are shown next to the gate contact metal 112 with the work function metal layer 110 and high k dielectric layer 108 also present. As can be seen in FIG. 2, the WFM layer 116 is chamfered to a specific height above the fin top. The high k dielectric layer 108 is also chamfered. These features form a final metal gate stack 120. The metal gate stack 120 is surrounded by a contact etch stop layer 126. Since the gate metal fill and CMP processes have occurred, an interlayer dielectric 122 is filled in between the metal gate stacks 120 with source/drain epitaxy 124 disposed between metal gate stacks 120.

Figure 3:
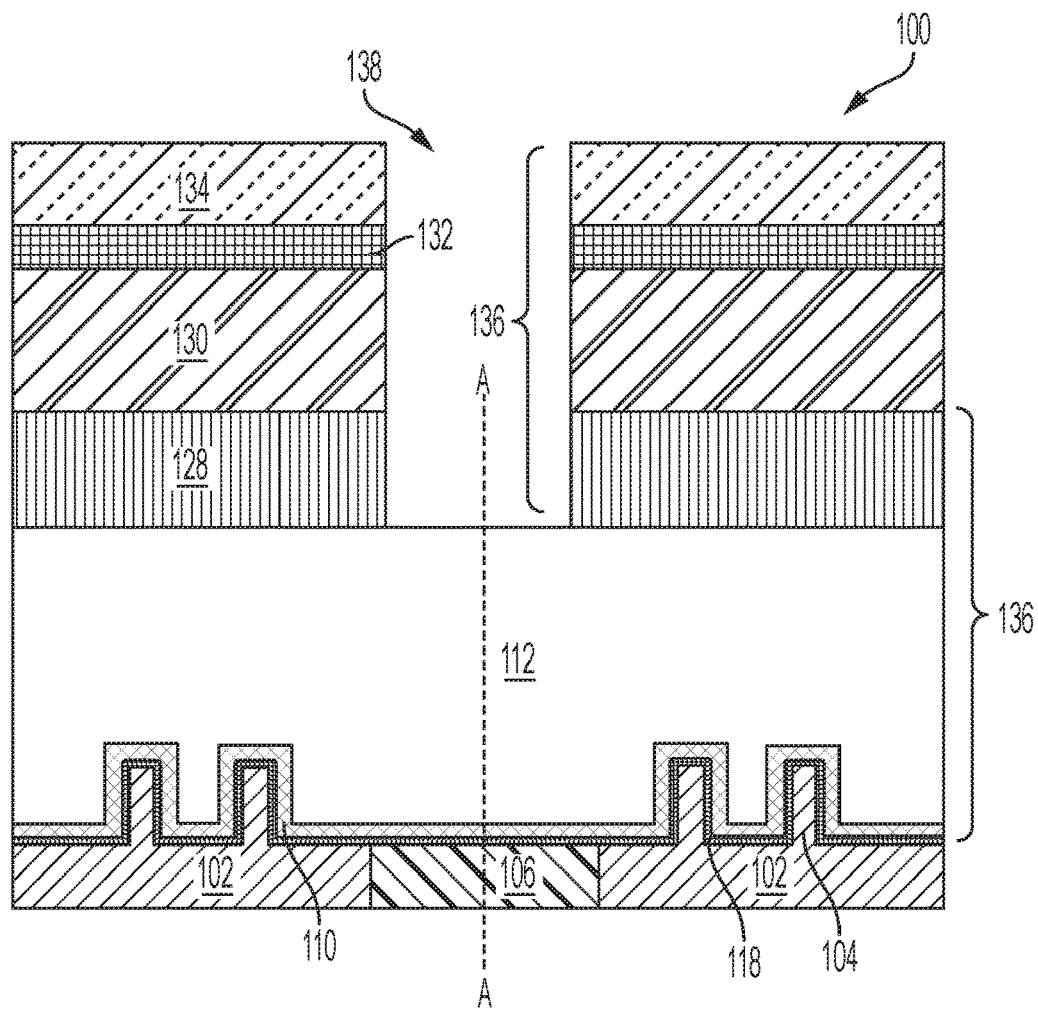
FIG. 3 depicts a cross-sectional view of the semiconductor device after fabrication operations according to embodiments of the invention, wherein the view is taken along the gate.
Figure 4:
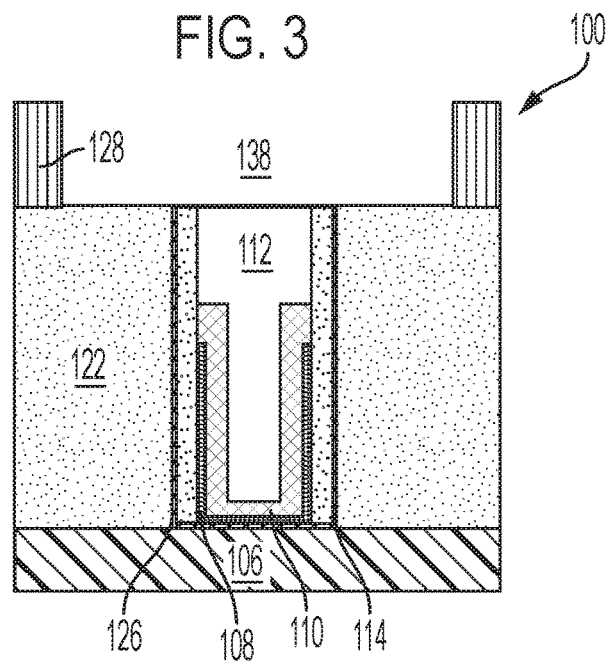
FIG. 4 depicts a cross-sectional across the gate view of the intermediate semiconductor device after fabrication operations according to embodiments of the invention, wherein the view is taken along line A-A of FIG. 3.

In FIG. 3, which is a cross-sectional view of the intermediate semiconductor device 100 taken along the gate region, several processes have been performed. First, a hard mask layer 128 was deposited followed by a lithography patterning step deposition of an organic planarization layer 130, anti-reflective coating layer 132 and a photoresist layer 134. The gate cut lithography process was then completed to form the required gate cut patterns to be transferred and etched into the metal gates. The process can include opening gate portions to be cut, transferring and patterning a gate cut 138 into the hard mask layer 128. The hard mask layer 128 can include an insulating material such as a nitride or an oxide. For example, the insulating material can include silicon nitride, silicon oxide, SiBCN, SiOCN, aluminum oxide, hafnium oxide, or a combination including at least one of the foregoing. The hard mask layer 128 can have a thickness of 5-50 nm and be able to withstand anisotropic plasma etching of the work function metal layer 110 and the gate contact metal 112. It can be important that the hard mask layer 128 does not unreasonably decrease in size and the gate cut pattern does not increase in size during anisotropic plasma etching to maintain the desired gate cut critical dimension. Optionally, a protective spacer can utilized for gate cut critical dimension shrinkage and to protect the hard mask against critical dimension blow up. FIG. 4 is an across gate view of the intermediate semiconductor device of FIG. 3 taken along line A-A where the hard mask layer 128 is shown deposited on the interlayer dielectric 122. The gate cut 138 is also shown.

Figure 5:
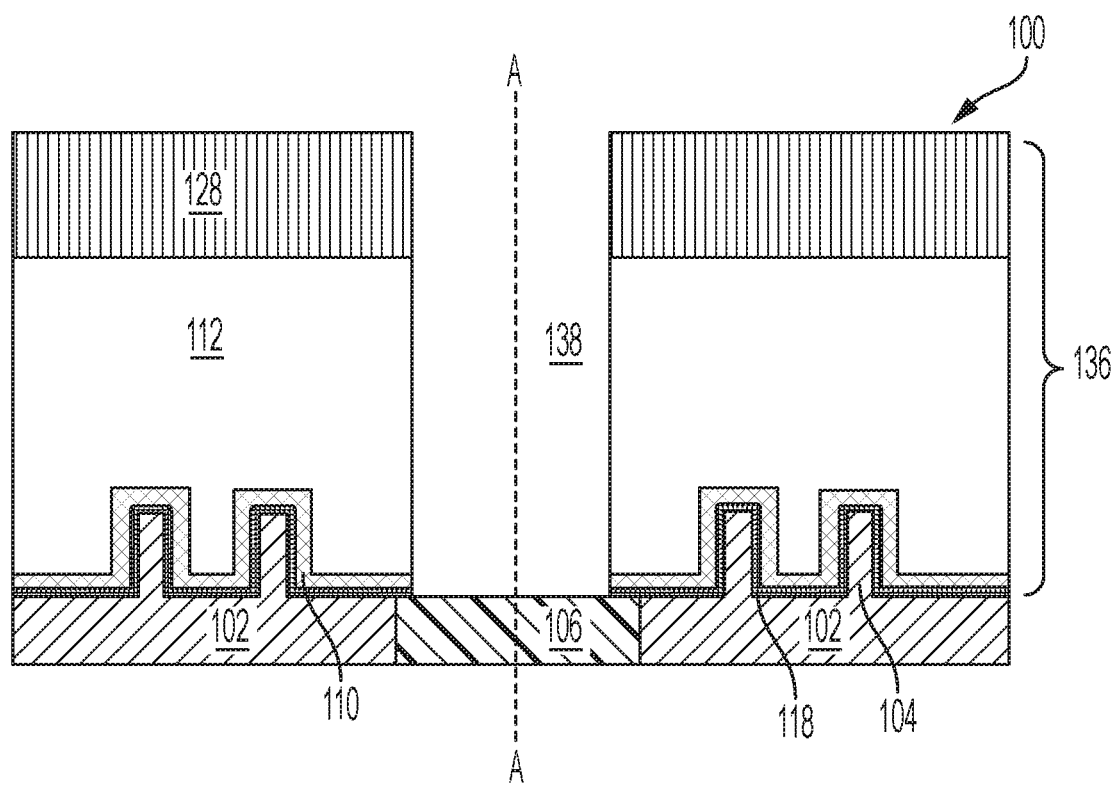
FIG. 5 depicts a cross-sectional view of the semiconductor device after fabrication operations according to embodiments of the invention, wherein the view is taken along the gate.
Figure 6:
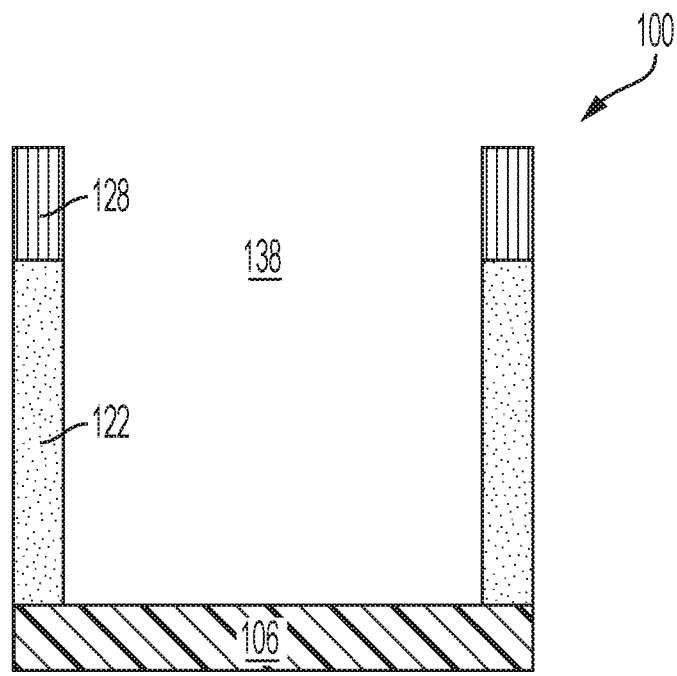
FIG. 6 depicts a cross-sectional across the gate view of the intermediate semiconductor device after fabrication operations according to embodiments of the invention, wherein the view is taken along line A-A of FIG. 5.

In FIG. 5 and FIG. 6, removal of the patterning stack (OPL/ARC/resist) is completed using a selective RIE or wets process and is followed by an anisotropic etch of the gate metal with interlayer dielectric 122 loss allowed. Interlayer dielectric loss should be limited to less than or equal to 10 nanometers.

Figure 7:
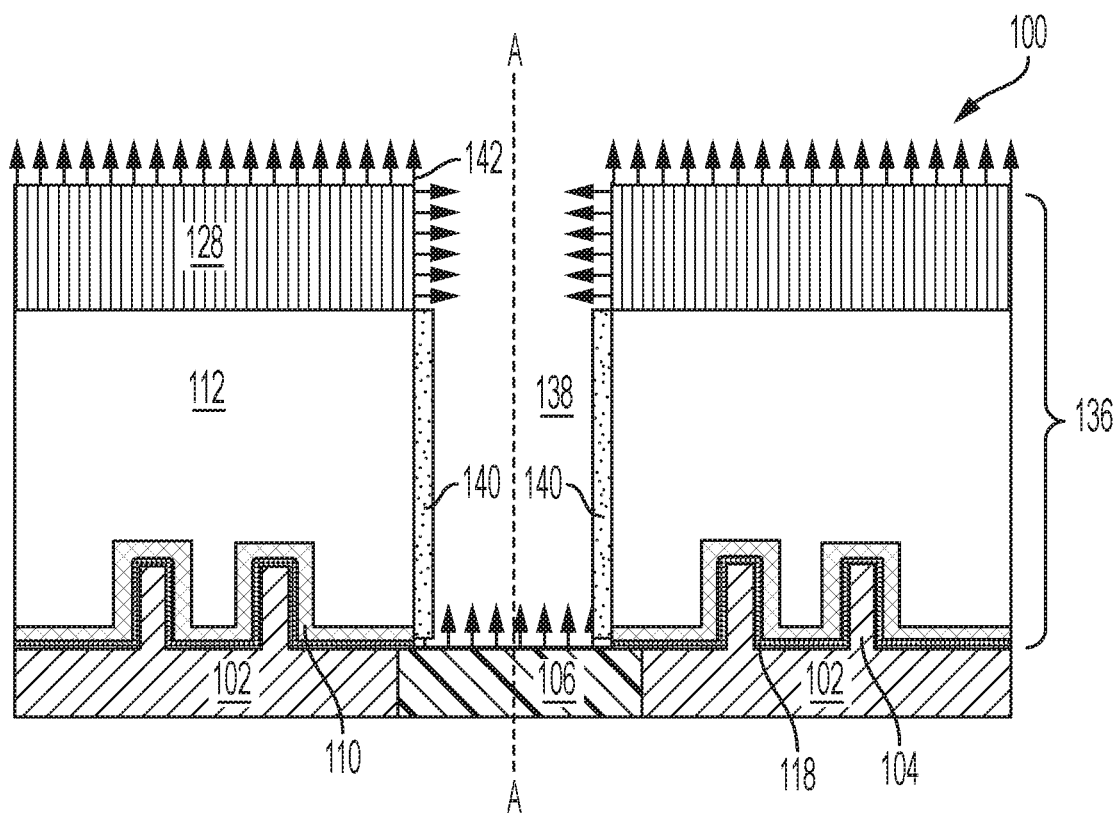
FIG. 7 depicts a cross-sectional view of the semiconductor device after fabrication operations according to embodiments of the invention, wherein the view is taken along the gate.
Figure 8:
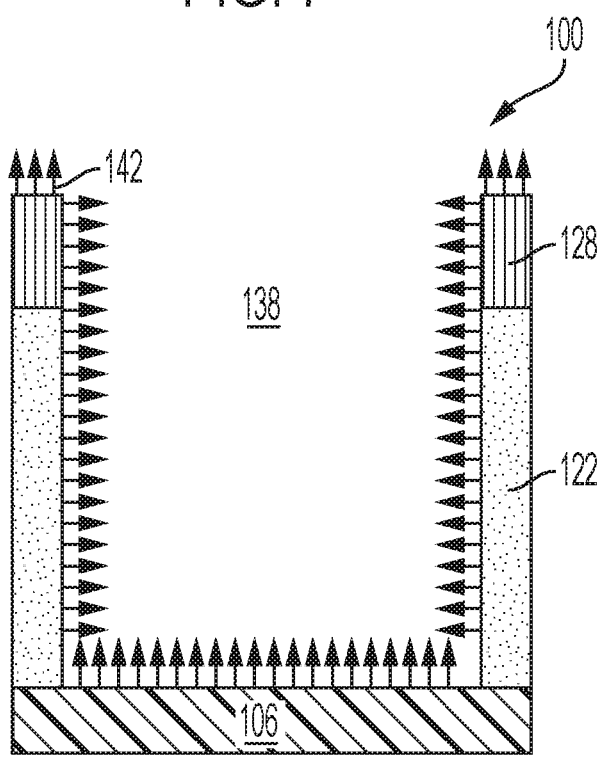
FIG. 8 depicts a cross-sectional across the gate view of the intermediate semiconductor device after fabrication operations according to embodiments of the invention, wherein the view is taken along line A-A of FIG. 7.

FIG. 7 and FIG. 8 demonstrate a gate cut in the replacement metal gate stack 136 using selective deposition of an insulating material, e.g., SiN, on exposed metal gate ends, forming an insulating cap layer 140 on each replacement metal gate stack 136. Selective deposition can be completed by protecting an oxide portion of the interlayer dielectric 122, the spacer, and/or the hardmask 128 with a passivation layer 142 that is configured to selectively bind to the oxide and not the metal of the replacement metal gate stack 136. The passivation layer 142 can include a self-assembled monolayer. For example, the self-assembled monolayer can include alkylsilanes, aryl silanes, or a combination including at least one of the foregoing. The alkylsilanes can include chlorosilanes, alkoxy silanes, or a combination including at least one of the foregoing. The cap layer 140 can be deposited on the gate contact metal 112 of the replacement metal gate 136, but not deposit on the interlayer dielectric 122 facing the gate cute 138 or on any nitride present in the intermediate semiconductor device 100 when the passivation layer 142 is present. The passivation layer 142 can prevent dielectric deposition.

Figure 10:
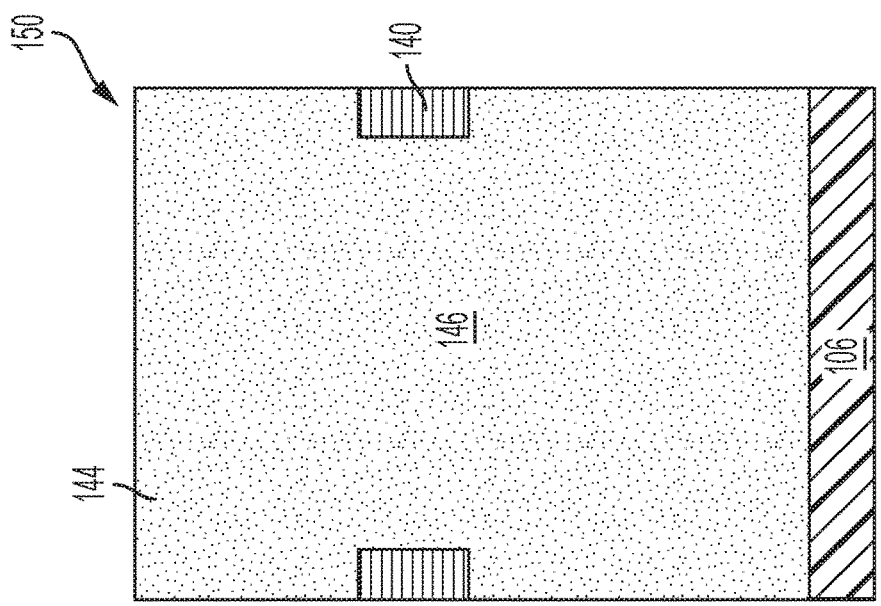
FIG. 10 depicts a cross-sectional across the gate view of the intermediate semiconductor device after fabrication operations according to embodiments of the invention, wherein the view is taken along line A-A of FIG. 9.
Figure 9:
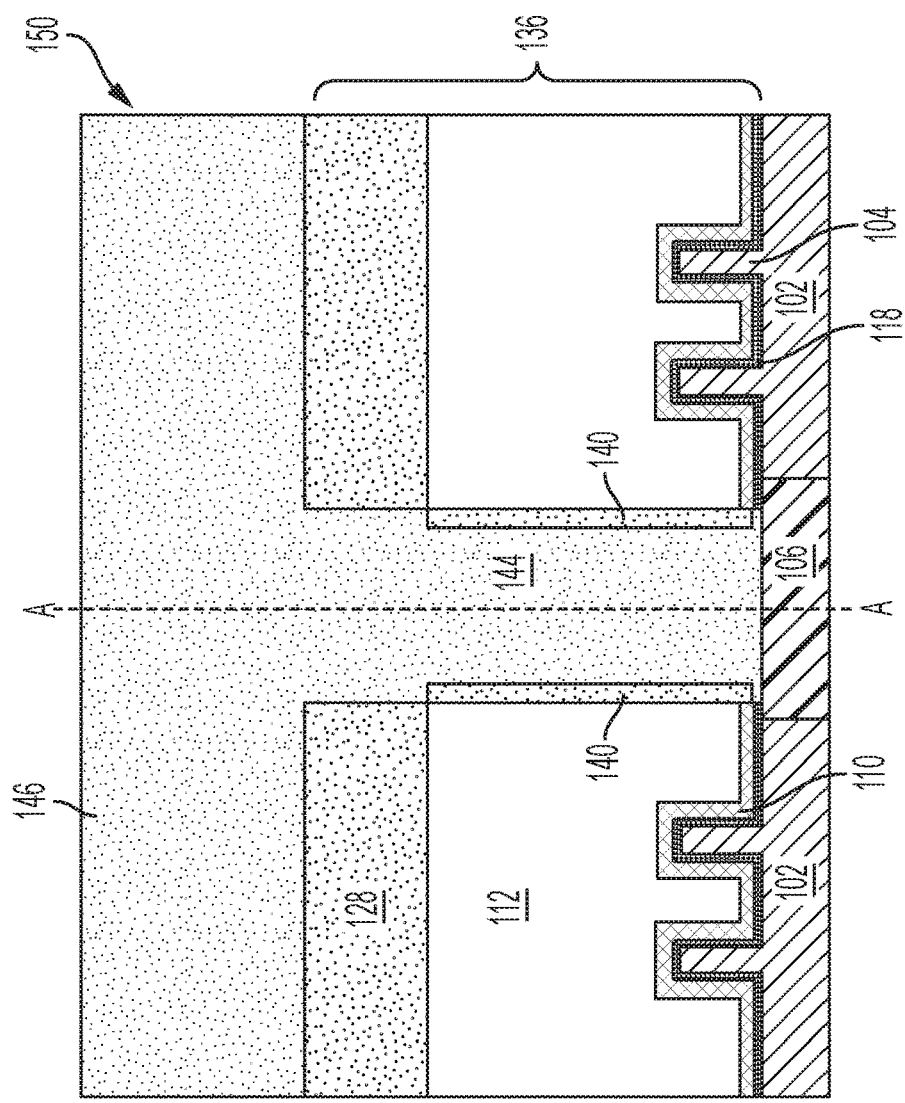
FIG. 9 depicts a cross-sectional across the gate view of the intermediate semiconductor device after fabrication operations according to embodiments of the invention.
Figure 12:
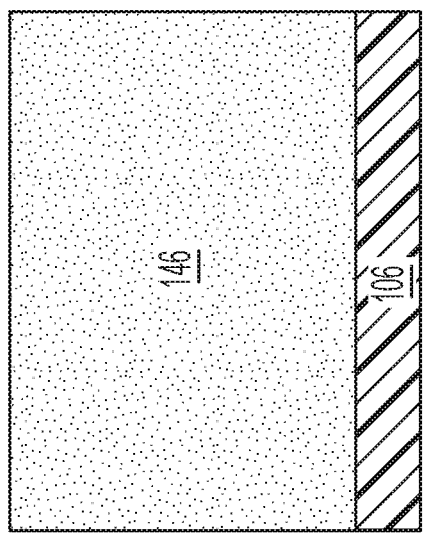
FIG. 12 depicts a cross-sectional across the gate view of the semiconductor device after fabrication operations according to embodiments of the invention, wherein the view is taken along line A-A of FIG. 11.
Figure 11:
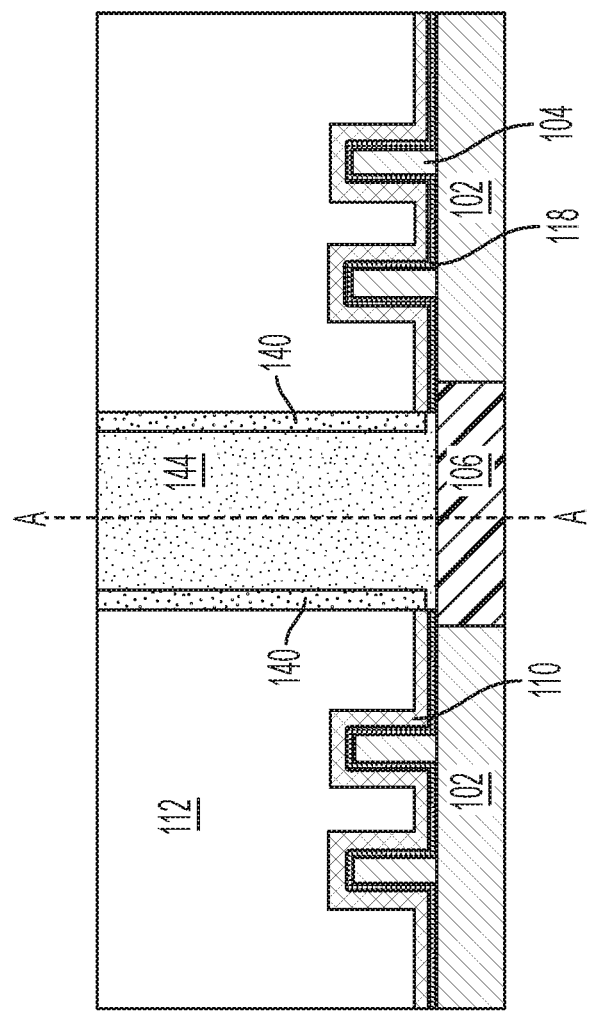
FIG. 11 depicts a cross-sectional view of the semiconductor device after fabrication operations according to embodiments of the invention, wherein the view is taken along the gate.

In FIG. 9 and FIG. 10, the passivation layer 142 is ashed prior to the deposition of an oxide (e.g., $SiO_2$) 146 to fill a trench 144 located between replacement metal gate stacks 136. In FIG. 11 and FIG. 12, a CMP process has been performed to remove part of the oxide 146, etching of the hard mask layer 128, and other traditional processes performed to form the semiconductor device 150.

Figure 15:
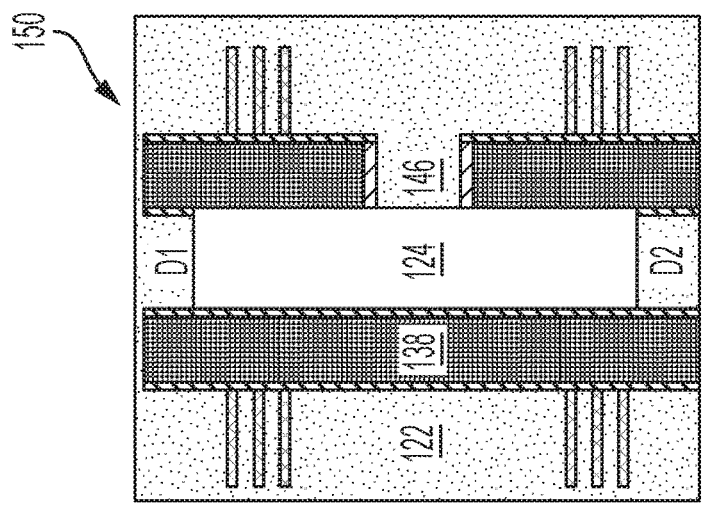
FIG. 15 depicts a cross-sectional view of the semiconductor device after fabrication operations according to embodiments of the invention, wherein an oxide fill of the gate cut has been performed.
Figure 14:
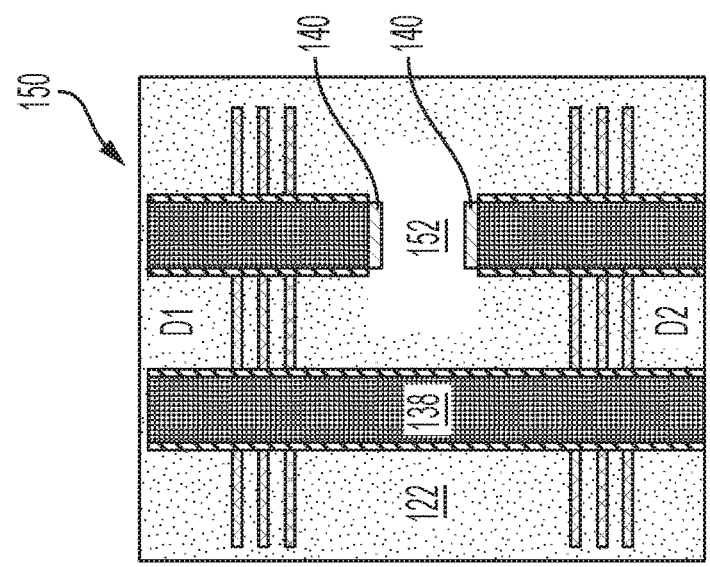
FIG. 14 depicts a cross-sectional view of the semiconductor device after fabrication operations according to embodiments of the invention, wherein a selective deposition of an insulating layer has been performed.
Figure 13:
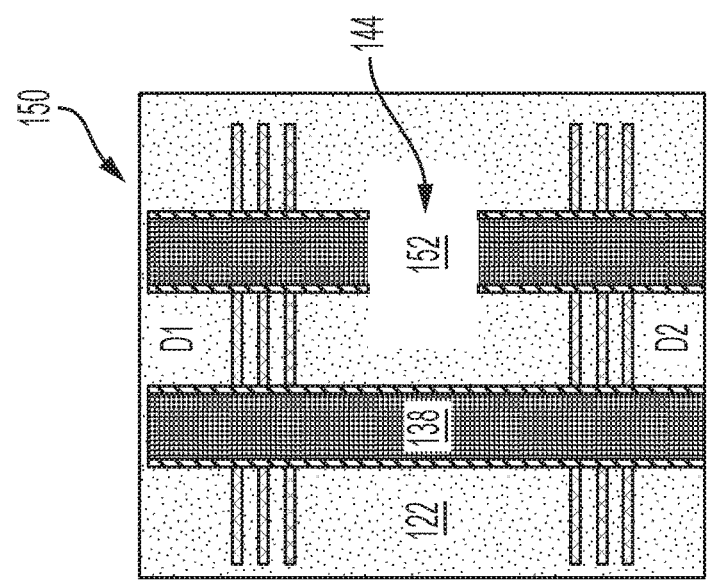
FIG. 13 depicts a cross-sectional view of a semiconductor device after fabrication operations according to embodiments of the invention, wherein a gate cut trench has been formed.

FIG. 13, FIG. 14, and FIG. 15 show other views of the semiconductor device 150. In FIG. 13, an anisotropic etch of metal and oxide is performed in the trench 144, maintaining the required critical dimension. The interlayer dielectric 122 surrounds the gate 138. Selective deposition of the insulating cap material 140, such as SiN, is performed on the exposed metal gate end as seen in FIG. 14. In FIG. 15, the trench 144 is filled with an oxide material 146 such that the gate ends are protected by the insulating cap material 140 to prevent source/drain contact openings as well as source/drain to gate end shorts.

Figure 16:
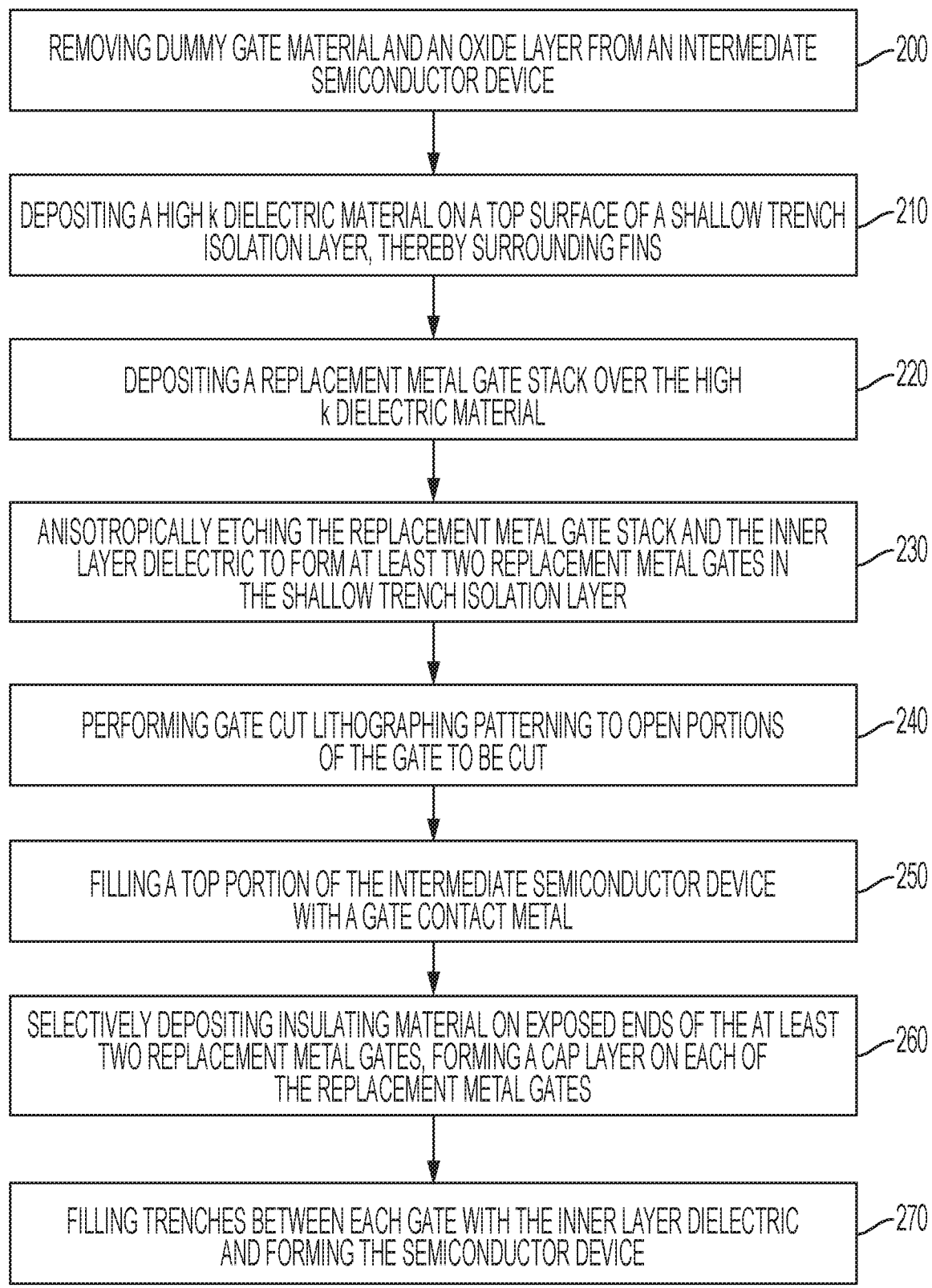
FIG. 16 depicts a flow diagram illustrating a method according to embodiments of the invention.

FIG. 16 is a depiction of a flow diagram illustrating a method according to one or more embodiments of the invention. In FIG. 16, at 200, a dummy gate material and an oxide layer are removed from an intermediate semiconductor device. The intermediate semiconductor device can also include a substrate, a plurality of fins, a shallow trench isolation layer, an oxide layer, and an inner layer dielectric. The fins extend into the dummy gate material. At 210, a high k dielectric material is deposited on a top surface of the shallow trench isolation layer, thereby surrounding the fins. At 220, a replacement metal gate stack is deposited over the high k dielectric material, while at 230, a top portion of the intermediate semiconductor device is filled with a gate contact metal. At 240, gate cut lithographing patterning is performed to open portions of the gate to be cut. At 250, the replacement metal gate stack and the interlayer dielectric are anisotropically etched to form at least two replacement metal gates in the shallow trench isolation layer. At 260, insulating material is selectively deposited on exposed ends of the at least two replacement metal gates, forming a cap layer on each of the replacement metal gates and at 270, trenches between each gate are filled with the inner layer dielectric to form the semiconductor device. The selective deposition of the insulating material on the ends of the replacement metal gates prevents gate end shorting to the source and drain contacts in the semiconductor device.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming an intermediate semiconductor device having dummy gate material and an oxide layer, wherein the intermediate semiconductor device further comprises a substrate, a plurality of fins, a shallow trench isolation layer, an oxide layer, and an interlayer dielectric, wherein the fins extend into the dummy gate material;
    removing the dummy gate material and the oxide layer from the intermediate semiconductor device;
    depositing a high k dielectric material on a top surface of the shallow trench isolation layer, thereby surrounding the fins;
    depositing a replacement metal gate stack over the high k dielectric material;
    filling a top portion of the intermediate semiconductor device with a gate contact metal;
    performing gate cut lithography and patterning to open portions of the gate to be cut;
    anisotropically etching the replacement metal gate stack and the interlayer dielectric to form at least two replacement metal gates in the shallow trench isolation layer;
    selectively depositing an insulating material on exposed ends of the at least two replacement metal gates, forming a cap layer on each of the replacement metal gates; and
    filling trenches between each gate with the interlayer dielectric and forming the semiconductor device;
    wherein selective deposition of the insulating material on the ends of the replacement metal gates prevents gate end shorts in the semiconductor device.

2. The method of claim 1, wherein the inner layer interlayer dielectric comprises silicon dioxide, silicon nitride, SiBCN, SiOCN, aluminum oxide, hafnium oxide, or a combination comprising at least one of the foregoing.

3. The method of claim 2, further comprising protecting an oxide portion of the interlayer dielectric with a passivation layer configured to selectively bind to the oxide and not to the metal of the replacement metal gates.

4. The method of claim 3, wherein the passivation layer comprises a self-assembled monolayer.

5. The method of claim 4, wherein the self-assembled monolayer comprises alkylsilanes, aryl silanes comprising a halide or alkoxy based head group, or a combination comprising at least one of the foregoing.

6. The method of claim 5, wherein the passivation layer comprises a polystyrene, poly methyl methacrylate based polymer brush layer tailored with a halide or alkoxy based head group
    comprising at least one of the foregoing.

7. The method of claim 1, wherein the cap layer is deposited on the metal of the replacement metal gates and wherein the cap layer does not deposit on the interlayer dielectric or nitride present in the semiconductor device when the passivation layer is present.

8. The method of claim 1, wherein dielectric loss is less than or equal to 10 nanometers.

9. The method of claim 1, further comprising applying a hard mask layer over the interlayer dielectric.

10. A semiconductor device comprising:
  a substrate including a plurality of fins and a shallow trench isolation layer;
  a high k dielectric material on a top surface of the shallow trench isolation layer, surrounding the fins;
  at least two replacement metal gates comprising a replacement gate stack over the high k dielectric material and a gate contact metal over the gate stack;
  a cap layer comprising an insulating material on exposed ends of the at least two replacement metal gates;
  a passivation layer configured to selectively bind to the oxide and not the metal of the replacement metal gates, wherein the passivation layer comprises a self-assembled monolayer with a head group tailored to bind to silicon oxide, wherein the self-assembled monolayer comprises alkylsilanes aryl silanes comprising a halide or alkoxy based head group, or a combination comprising at least one of the foregoing; and
  source and drain regions etched into the shallow trench isolation layer;
  wherein the cap layer prevents gate end shorts in the semiconductor device.

11. The semiconductor device of claim 10, wherein the insulating material comprises silicon oxide, silicon nitride, SiBCN, SiOCN, aluminum oxide, hafnium oxide, or a combination comprising at least one of the foregoing.

12. The semiconductor device of claim 10, wherein the alkysilanes comprise chlorosilanes, alkoxy silanes, or combination comprising at least one of the foregoing.

13. The semiconductor device of claim 10, wherein the cap layer is disposed on the metal of the replacement metal gates and wherein the cap layer is not disposed on an interlayer dielectric or nitride present in the semiconductor device when the passivation layer is present.

14. The semiconductor device of claim 10, wherein the gate metal comprises tungsten, cobalt, tin nitride, TiAlC, or a combination comprising at least one of the foregoing.

15. The semiconductor device of claim 10, further comprising a source and drain.

16. The semiconductor device of claim 10, wherein dielectric loss is less than or equal to 10 nanometers after reactive ion etching the replacement metal gates.

17. The semiconductor device of claim 10, further comprising a hard mask layer over an interlayer dielectric.

\* \* \* \* \*